(12) United States Patent
Woodberry

(10) Patent No.: US 6,885,203 B1
(45) Date of Patent: Apr. 26, 2005

(54) WAFER LEVEL BURN-IN USING LIGHT AS THE STIMULATING SIGNAL

(75) Inventor: Meral Bradley Woodberry, Ridgefield, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/526,955

(22) Filed: Mar. 16, 2000

(51) Int. Cl.$^7$ .............................................. G01R 31/02
(52) U.S. Cl. ...................................... 324/754; 324/752
(58) Field of Search ................................ 324/750–754, 324/763–765, 501; 385/14

(56) References Cited

U.S. PATENT DOCUMENTS

| | | | | |
|---|---|---|---|---|
| 4,053,833 A | * | 10/1977 | Malmberg et al. | 324/752 |
| 4,770,483 A | * | 9/1988 | Ridgway | 385/24 |
| 4,968,931 A | | 11/1990 | Littlebury et al. | |
| 5,047,711 A | | 9/1991 | Smith et al. | |
| 5,216,359 A | * | 6/1993 | Makki et al. | 324/750 |
| 5,381,103 A | * | 1/1995 | Edmond et al. | 324/753 |
| 5,631,571 A | * | 5/1997 | Spaziani et al. | 324/658 |
| 6,194,909 B1 | * | 2/2001 | Belforte et al. | 324/158.1 |
| 6,385,361 B1 | * | 5/2002 | Corr | 385/14 |
| 6,388,455 B1 | * | 5/2002 | Kamieniecki et al. | 324/752 |
| 6,448,802 B1 | * | 9/2002 | Hirt | 324/765 |

OTHER PUBLICATIONS

Article entitled, "Securing Known Good Die", by T. A. Williams, published in Advanced Packaging, Fall 1992, pp. 50–59.

Article entitled, Known–Good Die Poised to Take Off, by D. Maliniak, published in Electronic Design, Nov. 21, 1994, pp. 55–73.

Article entitled, Burn–In Co–Developed by TI, MicroModule System, Intel Launches 'SmartDie' Program, by Jim Detar, published in Electronic News, May 30, 1994.

Article entitled, "Known Good Die: A Commercial Solution for Burn–in and Test Before Packaging" by S–H Foo and L. Prokopchak, presented at Semicon Japan, Dec. 1994.

Article entitled, "Flexibility and Modularity Drive Today's Burn–In/Test Systems" by P. Mayerfeld, reprinted from EE–Evaluation Engineering, Nov. 1994.

Specification entitled, "Known Good Die—The Total Solution", AEHR Test Systems/Nitto–Denko.

* cited by examiner

*Primary Examiner*—Vinh P. Nguyen
(74) *Attorney, Agent, or Firm*—David C. Ripma; Matthew D. Rabdau; Joseph P. Curtin

(57) ABSTRACT

An apparatus comprises multiple light sources that are applied to specific locations on the surface of a wafer for the purpose of causing a component on a die to respond as if a digital signal had been applied to the component. The multiple light sources may comprise several thousand point light sources such as the individual fibers of a fiber optic bundle. The light is controlled in such a manner to stimulate operation of the electronic circuit for the purpose of burning in the circuit.

28 Claims, 5 Drawing Sheets

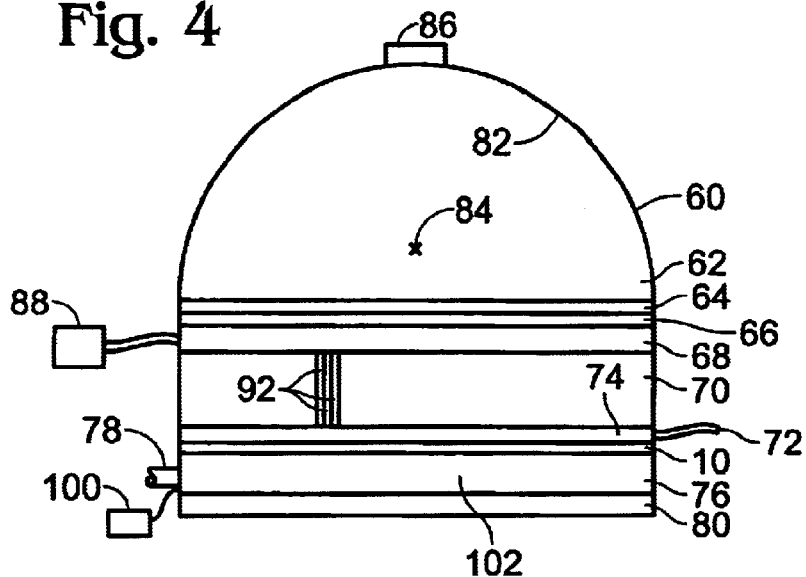
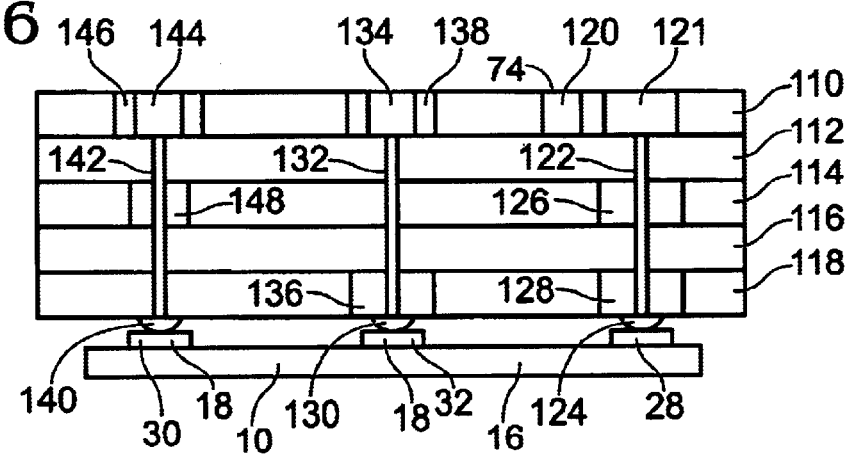
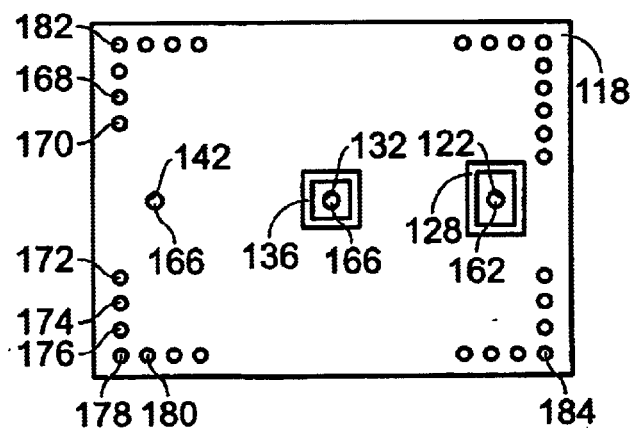

WAFER LEVEL BURN-IN USING LIGHT AS THE STIMULATING SIGNAL

FIELD OF THE INVENTION

This invention relates to the burning in of integrated circuits, and specifically to the burning in of integrated circuits in wafer form using light as the stimulating signal to facilitate a current flow to particular components on the integrated circuit.

BACKGROUND OF THE INVENTION

Integrated circuits are subject to early failure, also referred to as infant mortality, which is caused by latent defects in the circuits. In particular, semiconductors that have a relatively large die size and use thin oxides are susceptible to infant mortality problems. For quality reasons, circuit manufactures desire to remove these early failure circuits, or die, from the product line prior to shipment to customers. In addition, circuit manufactures desire to remove these early failure die from the product line prior to placement of the die into multi-chip modules (CM) where a single failed die may result in failure and scrapping of the entire MCM.

The bulk of these early failures can be detected prior to shipment of the circuits by exercising the circuits at a high temperature and a working voltage to simulate actual use. Exercising the circuit includes applying power and sending data signals to the circuit to activate various portions of the circuit. For example, in the case of a memory circuit each of the memory cells are exercised by storing and retrieving data from each of the cells. When this exercise process is performed at a high temperature, the process is called burn-in.

The conventional burn-in process is described in several references: Williams, Thomas, *Securing Known Good Due*, Advanced Packaging, page 50, Fall, 1992; Maliniak, David, *Known-Good Die Poised to Take Off*, Electronic Design, page 55, Nov. 21, 1994; AEHR Test Systems, *Known Good Die—The Total Solution*, company brochure, date unknown; Detar, Jim, *Intel Launches "SmartDie" Program*, Electronic News, May 30, 1994; U.S. Pat. No. 5,047,711, *Wafer-Level Burn-In Testing of Integrated Circuits*, to Smith et al., issued Sep. 10, 1991; Fee, See-Hack, *Known Good Die: A commercial Solution for Burn-in and Test Before Packaging*, presented at Semicon Japan, December 1994; Prokopchak, Lina, *Development of a Solution for Achieving Known-Good-Die*, presented at ITC, Washington, D.C., September 1994; Mayerfield, Pam, *Flexibility and Modularity Drive Today's Burn-In/Test Systems*, EE-Evaluation Engineering, November 1994; and U.S. Pat. No. 4,968,931, *Apparatus and Method for Burning In Integrated Circuit Wafers*, to Littlebury et al., issued Nov. 6, 1990.

To begin the conventional burn-in process, the individual die in wafer form are initially tested for minimal functionality for a short time and at ambient temperatures in a probe card station. This initial probe station test is run at a slow speed of approximately 5 MHz or less, due to possible interference problems. The test involves placing probes directly onto the pads of the die and then testing each of the die's components. The test may take approximately five seconds to three minutes per die, in addition to the relocation time of moving the probes from one die to another. Each of the die can be tested individually at the probe station because die in wafer form are not electrically connected to one another. Due to the short time period used to test each die, the die are tested sequentially until each die on the wafer has been classified as either good (pass) or bad (fail).

The good die are cut from the wafer and mounted in a package which is in turn mounted on a burn-in board. The die typically are permanently mounted in the package so that a die which fails final testing after the burn-in exercise will be discarded along with its package. A typical burn-in board includes space for multiple packages electrically connected to one another, for example, fifteen packages per board, so that the die on a single burn-in board can be exercised in parallel. Several burn-in boards are placed in a burn-in oven in an inert atmosphere for an extended period of time and exercised at a high temperature. In one example, 52 boards are exercised in a burn-in oven for 24 hours at a temperature of 125° C. The burn-in exercise is run at a speed of approximately 400 MHz to simulate actual working conditions. After the burn-in process, the die undergo a final test to eliminate those which have failed during burn-in. These failed die are removed from the product line.

Burn-in ovens may have a footprint of twelve square feet or more and may be over five feet tall. Accordingly, entire rooms or floors of fabrication facilities may be devoted to the burn-in process. Due to the long time frame and high temperature of the burn-in process, the energy usage is substantial. The process of placing the individual die in packages, placing the packages on the burn-in board, placing the burn-in boards in the burn-in ovens, and placing the packaged die in the final die tester is labor intensive.

The hardware used during the burn-in process is package specific. In other words, packages and burn-in boards for each specific type of die must be purchased. These costs can be enormous. In the case of multi-chip modules (CM), the package and burn-in board costs can be tenfold over the cost of single die packages and burn-in boards. These package and burn-in board costs continue to rise due to higher pin counts and specifications.

In one example, a wafer includes six hundred die. Each of the die are placed in a one-hundred-and-sixty pin package. Each package may cost $50 or more. The package is placed on a burn-in board that receives thirty-six packages per board and costs approximately $4,000. Seventeen boards are required to burn-in all the die from the single wafer. The cost of seventeen burn-in boards is approximately $68,000. The cost of six hundred packages is approximately $30,000. Moreover, the cost of the oven, energy usage, and labor must be added to these package and burn-in board costs.

Accordingly, manufactures are researching methods to simplify and minimize the cost of the burn-in process. Once method involves providing temporary packages for holding the die during the burn-in process. These temporary packages are expensive and have reliability questions surrounding their use. A substantial labor investment is still required in placing the die in these temporary packages. The energy usage of these temporary packages is generally similar to the requirements of the permanent packages.

A process that would allow wafer level burn-in exercising of individual die would eliminate the cost of packages and packaging labor for bad die, lower the cost of burn-in boards and allow more die to be placed in a single burn-in oven at one time. However, there are multiple obstacles to overcome in exercising die at the wafer level.

Each die has multiple signals that are required to control/exercise the die and multiple devices on each die that must be stimulated. Connection to a single die using electrical probes is common practice, as in the short duration, ambient temperature initial probe test mentioned above. However, the burn-in process takes a long period of time and is conducted at a high temperature and in an inert atmosphere. Accordingly, sequential wafer level burning in of the individual die on a wafer would not be time or cost efficient. If the electrical probe connection method were attempted for simultaneous wafer level burn-in for all die on the wafer, (using the same die example cited above) the probe card would require one-hundred-and-sixty pins times six-hundred die per wafer, or 96,000 probes. Each of these 96,000 probes must be aligned to connect to each of the corresponding die pads, without damaging the pads, to a tolerance of +/−0.001 inch, and must not drift out of this tolerance range during exercising of the circuit. Accordingly, the probes must not bend or bow due to temperature changes ranging from ambient to as much as 140° C. Each of these 96,000 connections must be made within the eight-inch diameter of the wafer. With so many electrical probes concentrated in such a small area, electrical noise and cross talk problems are inevitable. Wafer level burn-in using electrical probe connections does not appear to be feasible.

SUMMARY OF THE INVENTION

The method and apparatus of the invention facilitates burning in of integrated circuits in wafer form using light as the stimulating signal and using only a few electrical connections. The invention takes advantage of the circuit's normal sensitivity to light to facilitate flow of an electrical current to particular components on the die. The burn-in chamber of the present invention can be manufactured in a size of approximately one cubic foot, substantially reducing the floor space and energy requirements for the burn-in process.

The apparatus comprises multiple light sources that are applied to specific locations on the surface of the wafer for the purpose of causing a die to respond as if a digital signal had been applied to the circuit, or, in other words, for causing the circuit to respond as if it were an optical detector. In one example, the multiple light sources may comprise several million point light sources such as the individual fibers of a fiber optic bundle. The light is controlled in such a manner to communicate to intelligent devices on the die or to stimulate operation of the electronic circuitry of the die for the purpose of burn-in exercise signals. This apparatus and method of the present invention may also be used to test die for functionality.

The apparatus includes electrical power source and ground connections positioned on a probe card which are physically connected to the die using bump technology. In one embodiment a signal connection, also called a clock connection, is also physically connected to the die. The probe card includes multiple apertures for allowing light from a light source to impinge upon the die at predetermined locations. A fiber optical bundle is used to transmit light from the source to the probe card. The probe card may include optical markers for facilitating alignment of the probe card bump connections and the probe card light source apertures to corresponding predetermined locations on the die. Accordingly, the device allows for probe card alignment and exercising of the entire die by the use of only two or three mechanical connections and multiple, non-contact, optical connections.

Accordingly, it is an object of the present invention to provide a method and apparatus of burning in circuits in wafer form.

It is another object of the present invention to provide a method and apparatus of burning in circuits that is cost effective.

It is still another object of the present invention to provide a method and apparatus of burning in circuits that reduces the required number of physical connections to the die.

It is yet another object of the present invention to provide a method and apparatus of burning in circuits that reduces electrical noise and cross talk problems.

It is yet a further object of the present invention to provide a method and apparatus for optically aligning a probe card with a die.

It is another object of the present invention to provide a method and apparatus for powering on and off individual dies on a wafer.

These and other objects and advantages of the invention will become more fully apparent as the description that follows is read in conjunction with the drawings.

BRIEF DESCRIPTION OF THE DRAWINGS

FIG. 4 shows a cross-sectional view of the burn-in chamber of the present invention.

FIG. 6 shows a side view of a portion of the probe card of FIG. 4.

FIG. 13 shows a plan view of the signal layer of the portion of the probe card of FIG. 6.

DETAILED DESCRIPTION OF THE PREFERRED EMBODIMENTS

Figure 1:
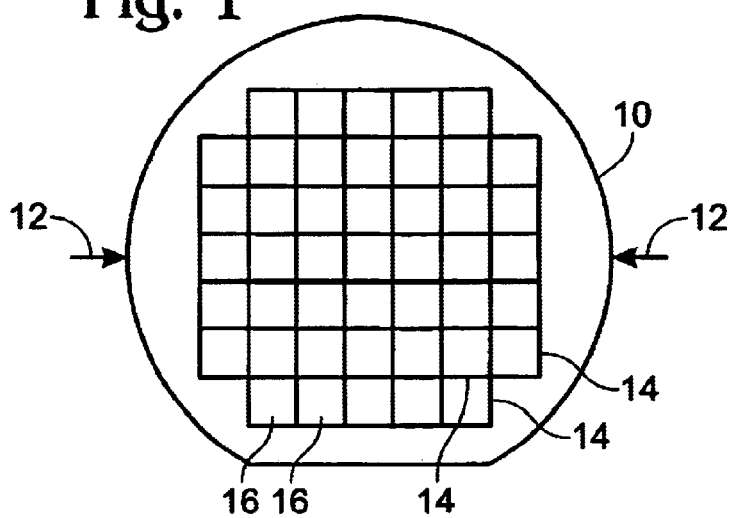
FIG. 1 shows a plan view of a wafer with multiple die positioned thereon.

Turning now to the drawings, and initially to FIG. 1, a semiconductor wafer 10 has a diameter 12 of approximately eight inches and scribe lines 14 that delineate multiple individual integrated circuits 16, also called die. The wafer shown includes forty-five identical die 16 but other numbers of die and other diameters of the wafer can also be used with the device and method of the present invention. In the wafer form shown, integrated circuits 16 are identical to but electrically isolated from one another.

Figure 2:
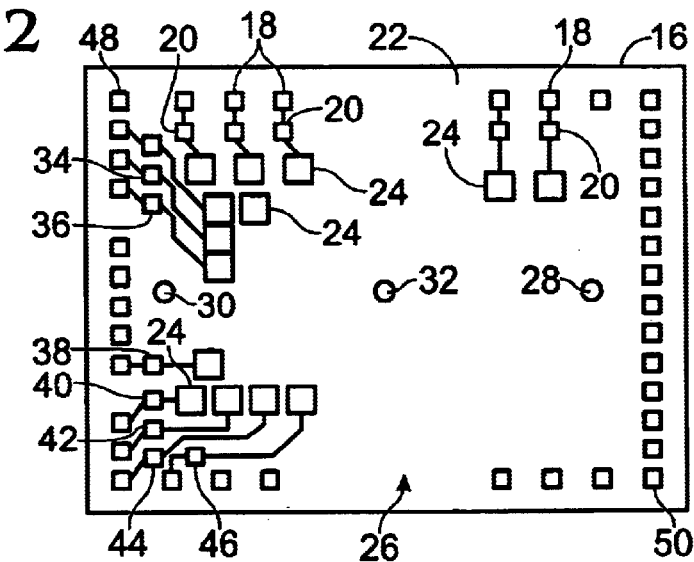
FIG. 2 shows a plan view of a single die from the wafer of FIG. 1.

FIG. 2 shows a detailed view of an individual die 16 from the wafer of FIG. 1. Die 16 includes a pattern of contact pads 18 and a pattern of optical regions 20, also called optically sensitive devices, positioned around an edge region 22 of the die. The contact pads allow sending and retrieving of signals, via a physical probe attached to the pad (not shown), to and from individual components 24 positioned on an interior region 26 of the die. Optical regions 20 of the die comprise a set of diodes that are electrically connected to contact pads 18 and function to ensure that voltage applied at a contact pad, and transmitted to a component 24, falls within a predetermined voltage range. Those skilled in the art will understand that, typically, each of contact pads 18 and optical regions 20 are connected to a corresponding component 24 but that only a few of the components are shown in the figure for ease of illustration. Contact pads 18 are used for testing of the die during the initial probe test described above. Contact pads 18 are also used for exercising the die during the conventional burn-in process described above wherein the electrical probes of a package are physically connected to the contact pads. Optical regions 20, heretofore, have not been used as an input or an output region for stimulation signals during the burn-in process.

Still referring to FIG. 2, contact pads 20 include specific contact points for power, ground and signal connections. In particular, contact point 28 is connected to an outside power source in order to power the die. Contact point 30 is connected to an outside electrical ground. Die designed specifically for use with the present invention may also include a contact point 32 connected to an outside signal device, also called a clock, as will be described in more detail below. Contact point 32 generally will be positioned in edge region 22 but is shown in the center of die 16 for ease of illustration. These contact points are electrical/mechanical connections between the die and the outside world. The layout of the die demonstrates, generally, the proportional size of the contact points and optical regions to the total surface area of the die.

Optical regions 34, 36 and 38, respectively, are connected to enable, gate and write components. Optical regions 40, 42, 44 and 46 are connected to output components that may command their corresponding optical region to emit an optical signal on command, i.e., these optical regions will individually light up when instructed to do so by their corresponding component 24. Optical regions 34 through 46 are used during the burn-in method of the present invention to verify that all of components 24 are being properly exercised. These optical regions are non-physical connections between the die and the outside world.

As an example, the component 24 connected to optical region 40 may be commanded to emit a "1" in which case optical region 40 will light up. This optical output of the region can be detected by a corresponding optical fiber strand(s) as will be described below. In this manner, testing as well as exercising of the components of the die can be verified in real-time during the burn-in process.

Die 16 may also include alignment pads 48 and 50 used to align a probe card on the die. In a preferred embodiment, pads 48 and 50 are optical regions that allow alignment of the probe card of the present invention using optical signals and a pattern recognition system that indicates to a controller when the optical signals are aligned with alignment pads 48 and 50.

Those skilled in the art will understand that each of the optical regions shown on the die typically is electrically connected to a unique component positioned internally within the die wherein each component has a unique function. Using the device of the present invention, the component is exercised by sending a light signal to the corresponding optical region. The optical regions preferably are positioned in edge region 22 so that the interior components are not damaged during the exercising process and so that the optical regions can be easily located. However, the optical regions may be positioned at any location on the die, depending on the particular design of the die. Other numbers, sizes, and arrangements of optical regions, contact pads and alignment pads may also be used as is desired for a particular application.

Figure 3:
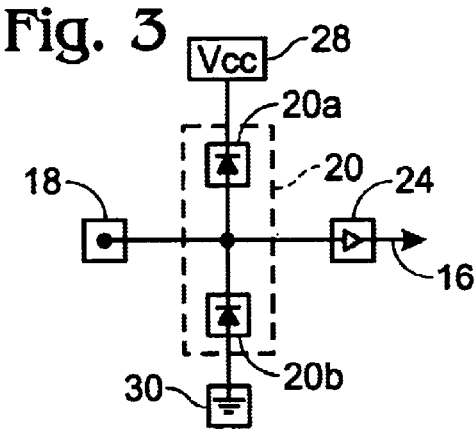
FIG. 3 shows a schematic view of two optical contact regions and a contact pad of a die of the wafer of FIG. 1.

FIG. 3 illustrates schematically the relationship between several elements of die 16 and the fundamental principle of the present invention. In particular, optical region 20 is shown comprising two individual optical regions 20a and 20b, which are electrically connected to contact pad 18. In the preferred embodiment, optical regions 20a and 20b each comprise an electrostatic discharge (ESD) protection diode. (Each of optical regions 20 shown in FIG. 2 preferably will comprise two individual optical regions 20a and 20b as shown in FIG. 3.) If an input protection diode were found to be optically sensitive, or if the input protection diode were designed to be optically sensitive, these diodes would be an ideal optical region target of the present invention. Moreover, other nodes of die 16 could be designed with an optically sensitive component accessible for this technology.

Diode 20a is connected to a power source through contact point 28. Diode 20b is connected to a ground through contact point 30. Contact pad 18 and diodes 20a and 20b are each connected to component 24 which in turn typically is connected to other components 24 of die 16. The orientation of diodes 20a and 20b ensures, under typical operating conditions, that the voltage at component 24 is within the range of ground (zero volts) and the voltage of the power source, also called Vcc. If the voltage at contact pad 18, or component 24, is greater than the voltage of power source 28, diode 20a biases the current, i.e., allows the current to flow through diode 20a toward source 28, to lower the voltage at the contact pad to that of the voltage of power source 28. If the voltage at contact pad 18, or at component 24, is less that ground, i.e., a negative voltage, diode 20b biases the current, i.e., allows the current to flow through diode 20b toward contact pad 18, to increase the voltage at the contact pad to that of a zero voltage.

For example, during the conventional burn-in process a probe is physically connected to contact pad 18 and a current is applied. If the current applied results in a voltage at the contact pad that is greater than Vcc, diode 20a will bias the current to flow toward source 28 thereby drawing contact pad 18 toward the voltage of power source contact point 28. If the current applied results in a voltage at the contact pad that is less than ground, diode 20b will bias the current to flow from ground 30 thereby drawing contact pad 18 toward the voltage of ground contact point 30. If the current applied at contact pad 18 is within the range of zero volts to the voltage at Vcc, the diodes will not bias current and the current will flow into component 24 and cause component 24 to respond appropriately. In this manner, as known by those skilled in the art, direct physical/electrical contact with contact pad 18 allows exercising of component 24 during the burn-in process.

In contrast, the process and apparatus of the present invention allows exercising of component 24 during the burn-in process by the use of optical signals, and without the need for a direct physical/electrical connection to contact pad 18. The device and method of the present invention utilizes the internal connections of optical regions 20 with power source Vcc, already built into the die. However, die 16 may be specifically designed to position optical regions 20 in easily accessible locations on the die or to incorporate other optical regions for additional testing or exercising of the die.

To exercise component 24 using the method and device of the present invention, an optical signal, i.e., a light beam, is applied to optically sensitive diode 20a which results in current leakage at diode 20a. In other words, shining a light beam on diode 20a causes the diode to allow current to flow from Vcc toward the component. A flow of current toward the component through diode 20a is not typically permitted because diode 20a normally only allows a current flow toward Vcc. The flow of current from Vcc through diode 20a cannot be stored in contact pad 18 (the contact pad typically has no capability to store a charge) and cannot flow toward ground 30 due to diode 20b. (The optical illumination beam of the present invention, therefore, should stimulate only diode 20a or 20b, but not both diodes at the same time.) Accordingly, the current leakage of diode 20a will result in a current flow from Vcc to component 24, the same result as when current is applied via a physical connection at contact pad 18.

In the alternative, if one desires to draw a current from component 24, an optical signal, i.e., a light beam, is applied to optically sensitive diode 20b (and not simultaneously to diode 20a). This will result in current leakage at diode 20b thereby biasing current from the component toward ground 30. Accordingly, stimulating diode 20b has the same effect as physically drawing a current from contact pad 18.

Drawing current through either of diodes 20a or 20b in the "leakage" direction, i.e., opposite to the normal biased orientation of the diode, will cause component 24 to respond appropriately, i.e., to respond in the same manner as during the conventional burn-in exercise mentioned above. A single electrical/mechanical connection on the die at Vcc contact pad 28, therefore, allows each of components 24 of the die to be exercised, rather than requiring an electrical/mechanical connection at each contact point 18. In this manner, the method and apparatus of the present invention allows exercising of components 24 during the burn-in process without requiring direct physical/electrical connection to contact pads 18.

Eliminating the need for a direct physical/electrical connection to each of contact pads 18 on a die provides the following advantages: allows wafer level burn-in of multiple die because optical signal fibers can be placed in a tighter arrangement than electrical probes; reduces energy costs because wafer level burn-in ovens can be small in size; reduces labor costs because each of the die do not need to be placed in a package; reduces the possibility of damage to the die by reducing the number of physical/electrical connections to the die; reduces the chance of noise and cross-talk problems because fiber optic strands typically do not have "noise" problems; reduces the cost of the burn-in process because packaging is not required; allows for automated optical alignment of the mechanical connections of a probe card with a die using pattern recognition technology; and allows for the powering on and off of individual dies on a wafer using optically sensitive switches built into the probe card.

The current leakage phenomenon of the diodes of a die discussed above may be described as the die's "normal sensitivity to light". For the apparatus and method of the present invention to function properly, diodes 20a and 20b should be optically accessible on the die. Die 16, therefore, preferably will be designed so that the diodes, or other possible optical regions 20, will be optically accessible and positioned in known locations. The known location of optical regions 20 on die 16 may be programmed into a computer so that a computer controlled optical source may activate particular optical regions upon command during a burn-in exercise, as will be further described below. Placement of die 16 in a package will generally cover these optically sensitive features so that regions 20 cannot be accessed. Accordingly, the method and burn-in chamber of the present invention typically will be used with die in wafer form, i.e., die not mounted in individual packages.

FIG. 4 shows a cross-section of a burn-in chamber 60. The chamber may be manufactured having a diameter of approximately one foot and a height of approximately one foot so that the chamber is only one cubic foot in size. The size of the burn-in chamber generally will be determined by the diameter of the wafer processed in the chamber.

Burn-in chamber 60 includes a multi-source light chamber 62, light control signals 64, a multi-filter mask 66, a light channel controller 68, a fiber optic block 70, electrical connections 72, a membrane probe card 74, a wafer (such as wafer 10 shown in FIG. 1), a temperature control device 76, a coolant connection 78, and a heating device 80. Of course, the particular arrangement and the particular elements are shown merely for illustrative purposes and other arrangements and elements may also be utilized in the device and method of the present invention.

In the preferred embodiment, multi-source light chamber 62 comprises a parabolic reflector 82 having a focal point 84. A light source 86 emits a source light beam, or beams, at focal point 84 so that light is reflected by the parabolic walls of the chamber downwardly and perpendicularly to the uppermost surface of probe card 74. Light source 86 may comprise one or multiple light bulbs that emit light at one or at multiple desired intensities. To achieve an increase in intensity, the wattage of the bulbs may be increased. The multiple light bulbs may also emit light at one of or at multiple wavelengths as desired. In another embodiment, light source 86 may comprise one or more lasers that emit, for example, red or green light, or light at other wavelengths, as desired. In another embodiment light source 86 may comprise a liquid crystal display panel thereby eliminating the need to light control signals 64. Any light source may be used as is appropriate for the particular burn-in procedure being implemented. The use of multiple light emitters in light source 86 allows for control of the optical stimulation of a variety of particular optical regions on a die.

As an example, an optical switch may be connected to the power source of an individual die wherein the switch in the on position would allow power to the die during the entire burn-in process. It may be desirable to toggle on and off separate optical regions of the die during the burn-in process. Accordingly, green laser light may be used for stimulating the optical switch and appropriate filters activated and deactivated to allow red laser light to stimulate the separate optical regions only at desired times. The use of filters, therefore, together with the multiple light sources allows for precise control of multiple optical stimulation procedures on the individual components of die 16.

Light control signals 64 may comprise a liquid crystal display (LCD) panel having an array of pixels measuring 1024 by 1024. Such a panel would comprise 1,048,576 individual pixels, each of which may be used to control individual fiber optic strands used to optically stimulate optical regions 20 on die 16. ("Stimulation of optical regions 20" refers to stimulation of either regions 20a or 20b.) An electrical connection is used to control signals 64, such as communication signal patterns or control vectors. Of course, other sized LCD panels or other light control signal devices may be utilized.

Multi light filter mask 66 is a light source filter used to filter light submitted to controller 68. The filter may comprise wavelength/color filters, such as red or green filters, that only allow the passage of a particular colored light when the filter is activated. Mask 66 may also comprise other standard optical filters such as polarizers, retarders, quarter-wave plates and the like used to control light received by the die. As discussed in the example above, filters 66 may be activated, i.e., turned on or off by the use of particular frequencies, and, in conjunction with multiple light sources 86, allow light to continually stimulate an optical switch to continually provide power to the die, and to toggle on and off particular optical regions of the die during the burn-in process. In the case of a wavelength filter, as will be understood by those skilled in the art, the filter typically will allow the passage of a particular range of wavelengths or several particular ranges of wavelengths during specified time periods, as opposed to allowing only a single wavelength to pass.

Multi-filter mask 66 may also be used to facilitate fast exercise times to realistically simulate actual use of the component. For example, the LCD panel of light control signals 64 may only operate at a speed of 1 millisecond per cycle. Mask 66 may be activated for only a portion of this millisecond time frame. Accordingly, within the millisecond that a particular fiber optic strand 92 is illuminated by LCD panel 64 of chamber 60, multi-filter mask 66 may be activated to allow light to pass to die 16 for only a portion of the millisecond time interval. In this manner, fast on/off cycle times may be achieved by using the relatively slow technology of an LCD panel in conjunction with a fast filter activated during the LCD illumination time period.

Light channel controller 68 typically comprises a computer 88 connected to light control signals 64 and is designed to control the light source pixels introduced to fiber optic block 70. Controller 68 may be positioned external to chamber 60 and comprise a standard personal computer connected to light control signal device 64 by a standard eight pin connector interface. In this manner, as an example, computer 88 will control the activation of each of the 1,048,576 individual pixels of light control signals 64, much the same way that a computer controls the individual pixels of a computer monitor. Those skilled in the art will understand that other light channel controllers may also be utilized.

Figure 5:
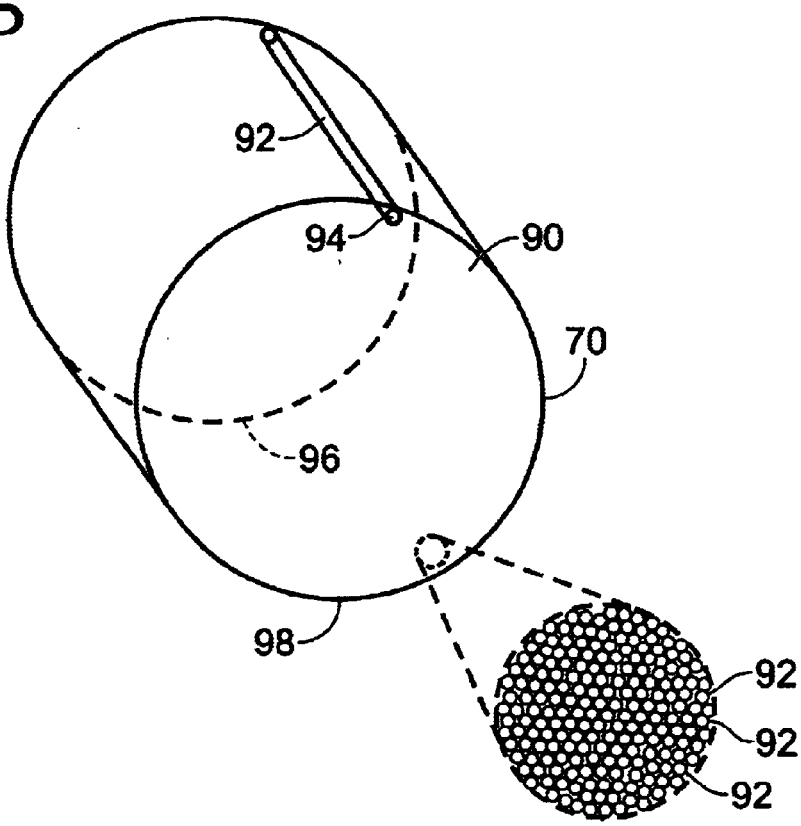
FIG. 5 shows a perspective sectional view of the fiber optic bundle of the burn-in chamber.

Still referring to FIG. 4, and further referring to FIG. 5, fiber optic block 70 typically comprises a fiber optic bundle 90 including several million individual fiber optic strands 92 tightly sandwiched together and extending between light channel controller 68 and membrane probe card 74. Preferably, no diffraction takes place within the strands of the fiber optic bundle. Each strand 92 typically has a diameter of $\frac{1}{1000}$ths of an inch, whereas optical regions 20 (FIGS. 2 and 3) typically have a diameter of approximately 28 mils. Accordingly, several adjacent strands 92 typically are activated by controller 68 when a particular optical region 20 is to be optically stimulated by light transmitted through strands 92.

Bundle 90 preferably is coherent meaning that a cross section 94 of a particular strand 92 will be positioned in the same location at an input end 96 and at an output end 98 of bundle 90. In the embodiment shown, individual fiber optic strands 92 are densely packed so that bundle 90 extends across the entire diameter of chamber 60 and, therefore, across the entire diameter 12 of wafer 10.

Individual strands of bundle 90 aligned with optical regions 20 of a die will be activated by controller 68 and LCD panel 64 during the burn-in process so as to stimulate optical regions 20 aligned with the particular strands. Individual strands unaligned with individual optical regions 20 will merely provide support and stability to the neighboring strands that are activated. Accordingly, fiber optic bundle 90 is scalable for burning in any sized wafer because the million or so stands of the bundle can be individually activated to apply a light beam to any location on the particular die. In other words, bundle 90 can be used for the stimulation of die having a variety of optical region locations, so long as the predetermined location of each of optical regions 20 is stored in the memory of controller 68, or in another such storage device. Moreover, the individual strands of bundle 90 may be sized to any desired diameter, or provided in other shapes, so that the device is scalable for burning in die having any size optical regions 20. The ability to control light emitted to individual strands in bundle 90 ensures that light is only presented to intended targets on the wafer.

Fiber optic block 70 typically is positioned approximately two inches above wafer 10 to prevent heat damage to the fiber optic strands from the wafer, which may reach temperatures during the burn-in process of approximately 125° C. or more. Moreover, fiber optic block 70 insulates the LCD panel from the high temperatures required for circuit burn-in.

In another embodiment, individual fiber optic strands 92 are flexible and not tightly packed so that each individual strand may be positioned in line with a particular optical region 20 on a die 16. However, this embodiment would likely eliminate the scalability and universal use of the upper components of chamber 60.

Electrical connections 72 include power, ground and signal connections to membrane probe card 74. The signal connections may be connected to pattern generators for generating electrical contact signals. The connections typically include simple electrical wiring but other connections may also be used.

Still referring to FIG. 4, membrane probe card 74 comprises multiple layers as will be described below, wherein the uppermost layer typically is connected to electrical connections 72. Probe card 74 is positioned directly above and is in contact with portions of wafer 10 across diameter 12. The probe card includes several physical/electrical connections to each die 16 on wafer 10. The probe card also includes optical switches associated with each die that are used to turn the individual die on or off. The description of the probe card with respect to FIGS. 6 through 13 will illustrate how apertures can be used to access light sensitive locations on the semiconductor die and how electrical contact can be made for power connections to each individual die using bump technology.

Temperature control device 76 typically comprises a thermostat 100 connected to an anodized aluminum plate 102 via a computer, wherein the plate is in direct contact with wafer 10. The plate serves as a support for the wafer and allows the application of heat to, or the dissipation of heat from, the wafer. During the burn-in process, the wafer is initially heated to an extreme temperature, such as 125° C., by the conduction of heat from heating device 80, through plate 76 and to wafer 10. Once the wafer is heated to this temperature, the individual components on each of the die of the wafer are exercised at a high speed. This produces excess heat on the wafer that should be dissipated to avoid damage to the die. At this point in the burn-in process, heating device 80 ceases to provide heat to plate 76 and coolant is run through the device at coolant connection 78. Heat is then conducted from the wafer, through plate 76 and out of the system by coolant connection 78. In this manner, wafer 10 is held within a desirable temperature range during the entire burn-in process.

Plate 76 preferably is anodized so that the electrical integrity of the wafer will not be compromised by contact with the aluminum plate. In the preferred embodiment, plate 76 can dissipate as much as 5000 watts of heat from the wafer during the burn-in process. Those skilled in the art will understand that other temperature controllers may also be used.

Coolant connection 78 is connected to temperature control device 76 and typically comprises piping that extends through plate 102 wherein a cooling gas or liquid is fed through the piping, as known in the art. Of course, other cooling devices may also be used to dissipate heat from wafer 10 during the burn-in process.

Heating device 80 may comprise a resistive heating coil, a ceramic heater, a moving gas or liquid heat exchanger system, or any other heating device sufficient for purposes of the present invention. Heating device 80 typically is in direct contact with aluminum plate 102 so as to allow direct heat conduction to the wafer through plate 102 from device 80.

FIG. 6 shows a side view of a section of probe card 74 and a die 16. The section shown typically is in an edge region of probe card 74 and includes three mechanical connections to the top of the probe card. In the preferred embodiment, probe card 74 extends across the full diameter 12 of wafer 10 so that a single probe card is used for simultaneously powering on and off all the die on the wafer during simultaneous burn-in of each die on the wafer.

In a preferred embodiment, probe card 74 includes a power source layer 110, an insulation layer 112, a signal layer 114, also called clock layer 114, an insulation layer 116, and a ground layer 118. Insulation layers 112 and 116 electrically isolate the layers on either side of the particular insulation layer, as will be understood by those skilled in the art. In one embodiment the insulation layers are manufactured of velum but any insulating material suitable to electrically insulate the source, signal and ground layers may be used. In one embodiment the power, signal and ground layers are manufactured of a metallic substance such as gold. Any other electrically conductive material, or combination of materials, may also be used.

Power source layer 110 includes a switch 120 movable between the on (closed) and the off (open) positions so as to control power to the entire probe card. In the preferred embodiment, switch 120 is an optical switch that moves between the open and the closed positions when a light signal is applied to the switch. Switch 120 is directly connected to layer 110 and extends through the entire depth of layer 110 so that the remainder of layer 110 is only powered when switch 120 is in the on position. Accordingly, switch 120 is the main control switch for simultaneously providing power to all the die on wafer 10.

A second switch 121 allows isolation or powering (when switch 120 provides power to layer 110) of a single die. In other words, a switch 121 is associated with each individual die whereas only one switch 120 is positioned on the probe card. Utilizing switch 121 to isolate an individual die reduces the problem of one die shorting out the power to all other die on the wafer when all the die are electrically tested in parallel.

Switch 121 is aligned with an electrical lead 122, also called a "via", that extends through layers 112, 114, 116, and 118. Lead 122 contacts layer 110 through switch 121 and terminates in an electrically conductive bump 124 positioned on an underside of layer 118. Bump 124 is mechanically connected to contact pad 28 of die 16 during the burn-in process so that a particular die is powered by the probe card through via 122. Lead 122 is electrically isolated from signal layer 114 by an isolation barrier 126 and is electrically isolated from ground layer 118 by an isolation barrier 128. Barrier 128 also electrically isolates bump 124 from ground layer 118. Lead 122 is electrically connected to metallic power source layer 110 through switch 121 so that an individual die on wafer 10 is electrically connected in parallel to the power source only when its corresponding switch 121 is in the on position.

Signal layer 114 is electrically connected to an electrically conductive bump 130 by an electrical lead 132 that extends from a signal switch 134. Lead 132 is electrically isolated from ground layer 118 by an isolation barrier 136 and switch 134 is electrically isolated from power source layer 110 by an isolation barrier 138. Barrier 136 also electrically isolates bump 130 from ground layer 118. Bumps 124 and 130, and leads 122 and 132 are manufactured of an electrically conductive material, such as gold, though other materials may be used. Those skilled in the art will understand that the isolation barriers surround the electrical leads but generally do not extend through the entire cross section of the probe card layer. Lead 132 is electrically connected to metallic signal source layer 114 so that each of the die on wafer 10 is electrically connected in parallel to the signal layers providing for simultaneous electrical connection of all the die on the wafer to signal layer 114.

Ground layer 118 is directly connected to the die by an electrically conductive bump 140. A lead 142 connects bump 140 to an electrical ground connection 144 through isolation barriers 146 and 148. The probe card of the present invention, therefore, mechanically contacts an individual die at three electrical connection points 124, 130 and 140. The probe card is also connected to the outside world, i.e., a power source, a ground, and a signal clock, at three points 120, 134 and 144.

For the wafer shown in FIG. 1, which has 45 individual die positioned thereon, probe card 74 will include 135 electrically conductive bumps. The remainder of the "connections" to the wafer will be optical connections, as will be described below in more detail. The probe card, however, will have only three outside contact points, i.e., 120, 134 and 144, on an upper side of layer 110. Other locations of the three outside contact points, such as a connection to the side of the probe card, may also be used.

Figure 7:
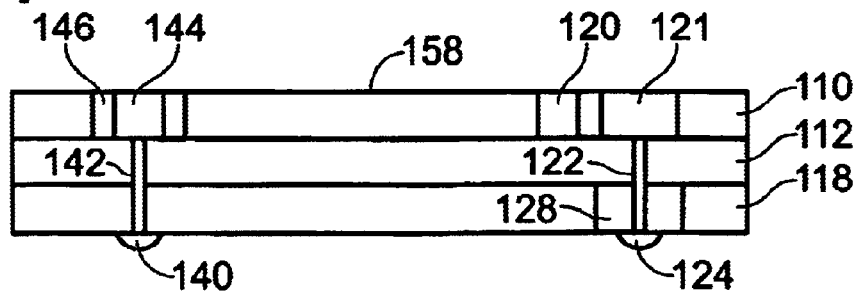
FIG. 7 shows a side view of a portion of another embodiment of the probe card.

FIG. 7 shows a cross section of another embodiment 158 of a probe card having only three layers. Prove card 158 includes power source layer 110, insulation layer 112, and ground layer 118. Switch 121 is connected to electrically conductive bump 124 by electrical lead 122. Isolation barrier 128 insulates lead 122 from ground layer 118. Electrical lead 142 is isolated from power source layer 110 by isolation barrier 146. This three-layer system provides for burning in of a die with only two mechanical connections to each die, i.e., bumps 124 and 140.

This three-layer embodiment is used in the device and method of the present invention when relatively slow electrical speeds, such as speeds slower than 2 MHz are required for exercising each component. For example, LCD panel 64 is capable of changing the activation of individual pixels at a speed of approximately only one millisecond per on/off cycle. However, stimulation of a particular component 24 on die 16 may be desired at much faster speeds. The speed of many currently available die is 400 MHz or faster.

Accordingly, when faster electrical speeds are desired, such as faster than one millisecond, the probe card of FIG. 5, having signal layer 114 with physical connection at bump 130, is preferred because the contact pad 18 of a particular component can be contacted at bump 130.

Figure 8:
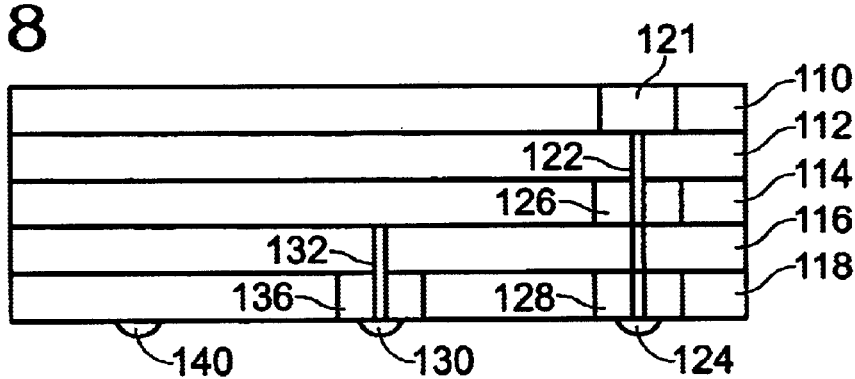
FIG. 8 shows a side view of another portion of the probe card of FIG. 6.

FIG. 8 shows another cross-section of probe card 74 shown in FIG. 6. In this cross sectional view, layers 110, 114 and 118 are electrically connected to and in parallel with corresponding contact points 124, 130 and 140 aligned with a particular die, through the continuous layers of the cross-section shown in FIG. 6. Accordingly, leads 122 and 132 need only extend upwardly to the desired layer of the probe card. In particular, bump 124, via lead 122, is electrically connected to power source layer 110 through switch 121 and is isolated by barriers 126 and 128. Bump 130, via lead 132, is electrically connected to signal layer 114 and is isolated by barrier 136. Bump 140 is directly electrically connected to ground layer 118. Contact points 124, 130 and 140 are different from, and are aligned with a die that is different from, the die shown in FIG. 6. In other words, probe card 74 includes multiple sets of three contact points 124, 130 and 140, wherein each set of contact bumps is aligned with a set of three corresponding contacts pads of a die.

Figure 9:
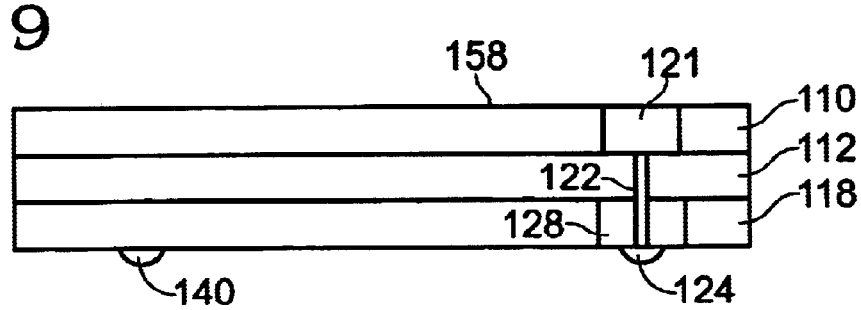
FIG. 9 shows a side view of another portion of the probe card of FIG. 7.

FIG. 9 shows another cross-section of probe card 158 shown in FIG. 7. In this cross sectional view, layers 110 and 118 are electrically connected to and in parallel with corresponding contact points 124 and 140, through the continuous layers of the cross-section shown in FIG. 6. Accordingly, lead 122 need only extend upwardly to the desired layer of the probe card. In particular, bump 124, via lead 122, is electrically connected to power source layer 110 and is isolated by barrier 128. Bump 140 is directly electrically connected to ground layer 118.

Figure 10:
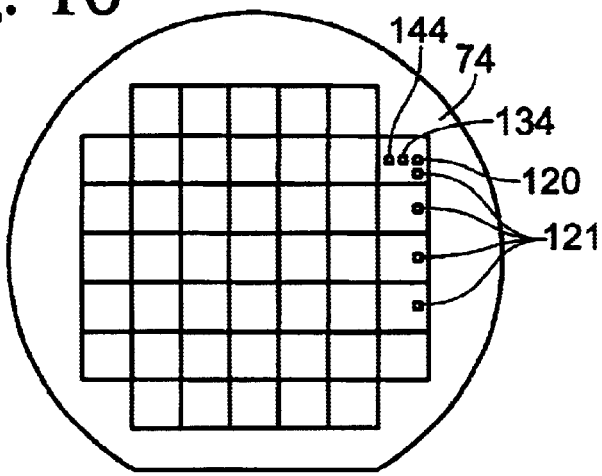
FIG. 10 shows a plan view of the entire probe card.

FIG. 10 shows a plan view of the entire probe card 74. The probe card includes the three mechanical connections 120, 134 and 144, positioned in an edge region of the probe card, and switches 121 aligned with each individual die (switches 121 are shown on only a few selected dies in FIG. 10).

Figure 11:
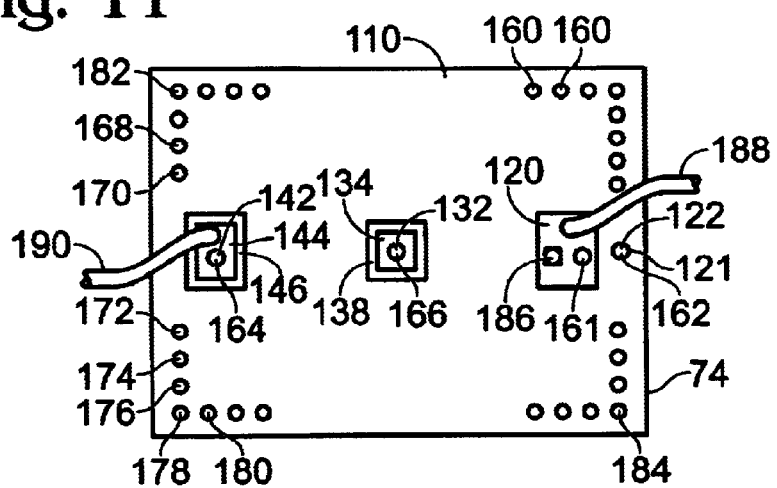
FIG. 11 shows a plan view of the power source layer of the portion of the probe card of FIG. 6.

FIG. 11 shows a plan view of power source layer 110 of probe card 74, in the portion of the probe card shown in FIG. 6. Power source layer 110 includes multiple apertures 160 that extend through layer 110 so as to allow the passage of a beam of light from fiber optic bundle 90 through selected apertures of the probe card. Some of the apertures are filled with conductive material to produce the electrical leads that extend through the probe card. Apertures 160 preferably are arranged on layer 110 so as to correspond to the position of optical regions 20 of die 16, shown in FIG. 2, so that light passing through apertures 160 will impinge upon a particular optical region 20. In a preferred embodiment, apertures 160 are created by layer technology including multiple deposition and etching steps. In one embodiment, apertures 160 have a diameter of approximately 3/1000ths to 4/1000ths of an inch. Other diameters will be appropriate for other particular die configurations. The apertures may also be drilled by mechanical or laser technology and typically will have a circular cross section.

For use with a particular designed die, probe card 74, including power source layer 110, will have apertures positioned in alignment with the optical regions of the particular die being burned in. Accordingly, those skilled in the art will understand that other sizes, shapes, numbers and arrangements of apertures will be utilized depending on the particular size, shape, number and arrangement of optical regions on the die being burned in. The apertures preferably have a size corresponding to the size of optical regions 20 on die 16 to reduce interference problems and to facilitate precise alignment of a beam of light passing through the aperture with the corresponding die optical region. Accordingly, several of individual fiber optic strands 92 may be activated to emit a light beam through a single aperture 160 having a corresponding sized diameter.

In particular, an aperture 161 is positioned adjacent to a power source input lead 188 for the formation of switch 120 within layer 110. An aperture 162 is aligned with power source contact point 28 of the die and is filled with conductive material to create lead 122, used for connection of power source layer 110 to the die. An aperture 164 is aligned with ground contact point 30 on the die. The aperture is filled with conductive material to create lead 142 for connection of a ground to bump 140 of the probe card. The aperture is positioned adjacent a ground lead wire 190 and is connected thereto by ground connection 144. An aperture 166 is aligned with signal contact point 32 on the die. The aperture is filled with conductive material to create lead 132 for connection of signal switch 134 to bump 130.

Apertures 168, 170 and 172, respectively, allow a light beam to stimulate enable, gate and write optical regions 34, 36 and 38 (see FIG. 2), respectively. Apertures 174, 176, 178 and 180 each allow a light beam to stimulate or receive optical output from output regions 40, 42, 44 and 46, respectively. Apertures 182 and 184 allow a light beam to track the position of alignment pads 48 and 50 to align the probe card on the die.

The portion of probe card 74 shown in FIG. 11 includes optical switch 120 for simultaneously powering on and off all the die on the wafer, switch 121 for powering on and off a particular die, signal switch 134 for passing an electrical signal directly to a particular contact pad on each die of the wafer, and ground contact connection pad 144 for connecting each die to the ground. (Switches 120, 121, and 134 are shown schematically.)

In a preferred embodiment, optical switch 120 includes an optical region 186 and switch 121 comprises an optical region at the uppermost portion of lead 122. The optical regions facilitate movement of the switches from the on (closed) to the off (open) position when the regions receive light at a particular intensity or wavelength.

For example, switch 120 may be activated by green light whereas switch 121 may be activated by red light. Mask 66 in the burn-in chamber may include a green filter that is continuously activated so as to allow the continuous passage of green light. The continuous green light may be used to continuously activate switch 120 to allow power to each die on the wafer. When the green filter is not activated, none of the die on the wafer will be powered. Mask 66 may include a red filter that is intermittently activated, or activated only in predetermined locations above the die, so as to allow red light to pass only when and where the red filter is activated. Activation of red light to particular switches 121 will allow power to each of die 16 that correspond to the activated switches (when switch 120 is also in the on position). Switches 121 allow control of individual die so that a shorted die may be electrically disconnected from the remainder of the good die being tested. Switches 120 and 121 may comprise any optical switch known in the art. Moreover, mask 66 may comprise other methods of control of the light impinging upon switches 120 and 121.

Signal switch 134 is mechanically connected to a controller for exercising a particular component 24 on the die at a high speed. Switch 134 is electrically isolated from power source probe card layer 110 by isolation barrier 138. As stated earlier, the on/off capability of an LCD panel is generally limited to a one millisecond per on/off illumination response time. Faster exercise times, i.e., shorter exercise time periods, such as 2 MHz or faster typically are desired. Accordingly, the mechanical connection of switch 134 to die 16 allows a single component to be exercised at a high speed by use of the mechanical connection.

Ground contact connection pad 144 electrically connects ground lead wire 190 to electrical lead 142. Lead 142 is comprised of aperture 164 which has been filled with conductive material. Connection pad 144 is electrically isolated from power source probe card layer 110 by isolation barrier 146.

Figure 12:
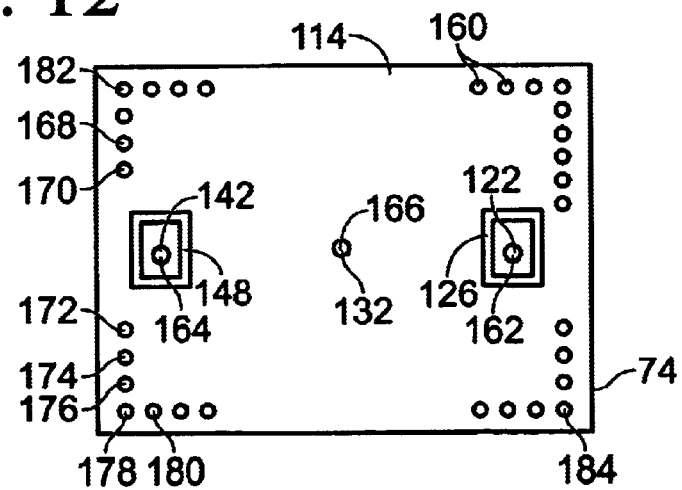
FIG. 12 shows a plan view of the ground layer of the portion of the probe card of FIG. 6.

FIG. 12 shows a plan view of signal layer 114 of probe card 74, in the portion of the probe card shown in FIG. 6. Signal layer 114 includes electrical lead 122, created by the filling of aperture 162 with conductive material, surrounded by isolation barrier 126. Electrical lead 132, created by the filling of aperture 166 with conductive material, is electrically connected to layer 114. Electrical lead 142, created by the filling of aperture 164 with conductive material, is surrounded by isolation barrier 148.

FIG. 13 shows a plan view of ground layer 118 of probe card 74, in the portion of the probe card shown in FIG. 6. Ground layer 118 includes electrical lead 122, created by the filling of aperture 162 with conductive material, surrounded by isolation barrier 128. Electrical lead 132, created by the filling of aperture 166 with conductive material, is surrounded by isolation barrier 136. Electrical lead 142, created by the filling of aperture 164 with conductive material, is electrically connected to layer 118.

Figure 14:
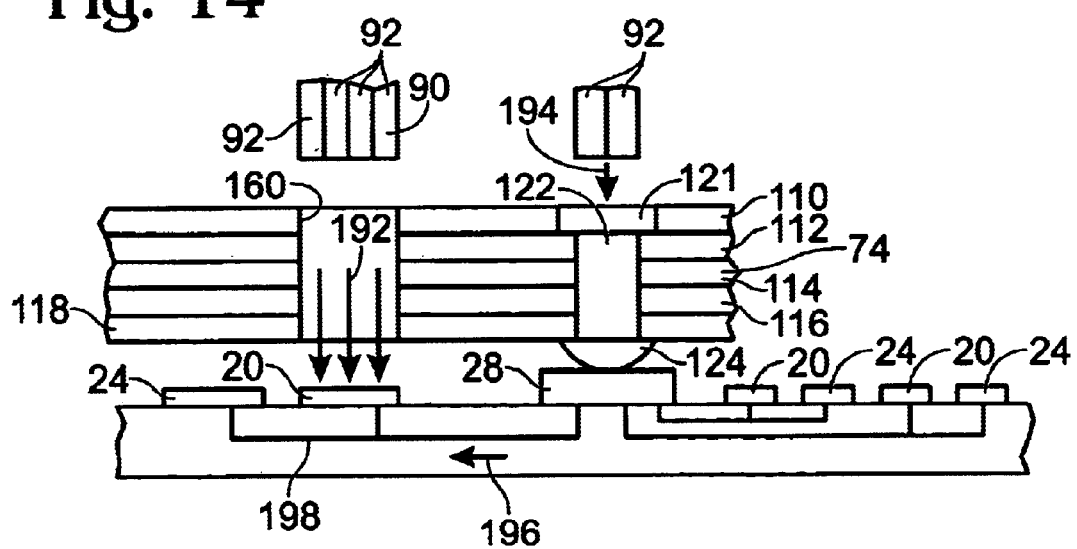
FIG. 14 shows a schematic representation of the method of the present invention.

FIG. 14 schematically shows use of the invention to optically stimulate a die 16 so as to produce a current at a particular component on the die. Particular stands 92 of fiber optic bundle 90 are aligned with a particular aperture 160 of probe card 74. Strands 92 are illuminated to produce a beam of light 192 that travels through aperture 160 and impinges upon optical region 20. (The optical region is shown raised above the upper surface of die 16 for purposes of illustration.) Another set of optical strands 92 is aligned with and stimulates switch 121 with a beam of light 194 so that the switch will allow power to the individual die shown.

Stimulation of optical region 20 is understood to mean stimulation of either of optical sub-regions 20a or 20b. Optical stimulation of region 20 results in leakage of the diode positioned at optical region 20. This leakage of the diode results in a flow of current 196 from power source Vcc through power source layer 110 and switch 121, electrical lead 122, bump 124, contact pad 28, and through internal die electrical connection 198, to component 24. After component 24 had been activated for a sufficient time period, mask 66 deactivates switch 121, or deactivates illumination though aperture 160, so that current no longer flows to component 24. Multiple components 24 are connected to single power source contact pad 28 so that only one physical/electrical connection to the die is required to individually exercise each component on the die.

Accordingly, the present invention comprises burn-in chamber 60 wherein only the probe card need be changed for the burning in a particular die. In other words, probe card 74 is manufactured so that apertures 160 in the probe card will be aligned with optical regions 20 on a die. For each different die, a different probe card will be manufactured. However, the remainder of burn-in chamber 60 is not die specific because the illumination of each optical fiber strand 92, and the duration of that illumination, can be controlled via computer programs and appropriate filters and light sources. Accordingly, the burn-in chamber of the present invention facilitates the burning-in of die at the wafer level, without requiring packages or burn-in boards.

Thus, a method and apparatus for wafer level burn-in of die has been disclosed. Although the preferred apparatus and method for performing burn-in has been disclosed, it should be appreciated that further variations and modifications may be made thereto without departing from the scope of the invention as defined in the appended claims.

I claim:

1. A method of exercising components on integrated circuits; comprising the steps of:
   providing a plurality of integrated circuits each having an optically sensitive device and a component wherein said optically sensitive device is electrically connected to said component;
   simultaneously connecting each of the plurality of integrated circuit to an electrical source; and
   optically stimulating as follows:
   providing a probe card having a plurality of apertures therein;
   aligning said apertures with ones of said optically sensitive devices;
   providing a source light beam through said aperture, to optically stimulate said optically sensitive devices; and,
   simultaneously optically stimulating said optically sensitive devices so as to allow current to flow through said optically sensitive devices from said electrical source to said components so as to exercise said components.

2. The method of claim 1 wherein said electrical source is a power source and wherein said current flow is a positive current flow to said components.

3. The method of claim 1 wherein said electrical source is an electrical ground and wherein said current flow is a negative current flow to said components.

4. The method of claim 1 wherein said optically sensitive devices are diodes.

5. The method of claim 1 wherein the step of optically stimulating said optically sensitive devices comprises providing a filter mask, and activating said filter mask for a predetermined time period to allow passage of a light beam through said filter mask to optically stimulate said optically sensitive devices for said predetermined time period.

6. The method of claim 1 wherein the step of providing a plurality of integrated circuits comprises providing a wafer having said plurality of integrated circuits thereon.

7. The method of claim 1 wherein the step of optically stimulating said optically sensitive devices comprises providing a fiber optic bundle having individual strands therein, aligning selected ones of said individual strands with ones of said optically sensitive devices, and providing a light beam through said selected ones of said individual strands to optically stimulate ones of said optically sensitive devices.

8. The method of claim 1 wherein the step of connecting the integrated circuits to an electrical source comprises providing a probe card having an electrical lead connected at a first end to said electrical source and connected at a second end to a plurality of electrically conductive bumps, and connecting said electrically conductive bumps to ones of said integrated circuits.

9. The method of claim 8 wherein said probe card includes multiple layers therein including a power source layer connected to said electrical lead, an insulation layer and a ground layer positioned opposite said insulation layer from said power source layer and connected to an electrical ground, and wherein said probe card further includes a plurality of apertures that each extend through said multiple layers so as to allow the passage of light through said probe card to said integrated circuits.

10. A device for exercising components on a plurality of integrated circuits, comprising:
a probe card including:
a power source connection electrically connected to an outside power source and electrically connected to a power source contact pad on each of a plurality of integrated circuits during exercising of the integrated circuits;
a ground connection electrically connected to an outside electrical ground and electrically connected to a ground contact pad on each of the plurality of integrated circuits dining exercising of the integrated circuits;
a plurality of apertures that extend through said probe card and that are aligned with an optically sensitive device on each of said integrated circuits during exercising of the integrated circuits; and
a light source that provides a bean of light through said apertures so as to optically stimulate said optically sensitive devices to exercise said integrated circuits.

11. The device of claim 10 further comprising a filter mask that allows passage of said beam of light through said apertures for a predetermined time period to optically stimulate said optically sensitive devices for said predetermined time period.

12. The device of claim 10 further comprising a fiber optic bundle having individual strands therein, wherein selected ones of said individual strands are aligned with said apertures, and, wherein said selected ones of said individual strands transmit said beam of light from said light source to said apertures.

13. The device of claim 10 wherein said light source is chosen from the group consisting of a light bulb, multiple light bulbs, a laser, multiple lasers, and a liquid crystal display panel.

14. The device of claim 10 further comprising a burn-in chamber containing said probe card and said light source, and further comprising a light control signal for controlling sail light source, a multi-filter mask for filtering said light, a light channel controller for controlling said light from said light source, a fiber optic block for transmitting said light from said light source to said probe card, a heating device for heating said integrated circuits, and a temperature control device for controlling said heating device.

15. The device of claim 14 wherein said burn-in chamber further comprises a parabolic reflector for directing said light to said probe card, said light control signal comprises a liquid crystal display panel, said multi-filter mask comprises at least one wavelength filter, said light channel controller comprises a computer, said fiber optic block comprises a fiber optic bundle, said heating device comprises heating coils, and said temperature control device comprises an anodized aluminum plate connected to a thermostat.

16. A device for exercising a component on an integrated circuit, comprising:
a probe card including:
a power source connection electrically connected to an outside power source and electrically connected to a power source contact pad on the integrated circuit during exercising of the integrated circuit;
a ground connection electrically connected to an outside electrical ground and electrically connected to a ground contact pad on the integrated circuit during exercising of the integrated circuit:
an aperture that extends through said probe card and that is aligned with an optically sensitive device on said integrated circuit during exercising of the integrated circuit; and
a light source that provides a beam of light through said aperture so as to optically stimulate said optically sensitive device to exercise said integrated circuit;
wherein said probe card extends across a diameter of a wafer containing multiple integrated circuits thereon and wherein said power source connection of the probe card comprises a power source layer that is connected to a power source contact pad on each of the integrated circuits during exercising of the integrated circuits, wherein said ground connection of the probe card comprises a ground layer that is connected to a ground contact pad on each of the integrated circuits during exercising of the integrated circuits, and wherein said probe card includes multiple apertures that extend through said probe card and are aligned with corresponding ones of an optically sensitive device of each of the integrated circuits during exercising of the integrated circuits.

17. A method of exercising components on a wafer of integrated circuit dies, the method comprising:
supplying a wafer including a plurality of integrated circuit dies, each die having an electrostatic discharge (ESD) protection circuit, including a pair of diodes connected between power and ground, electrically connected to a component;
simultaneously connecting each of the die to an electrical source;
optically stimulating the activated ESD protection circuits of each die; and,
supplying electrical test signals to the die components in response to the optical stimulation.

18. A device for exercising components on a wafer including a plurality of integrated circuit dies, the device comprising:
a probe card including:
a power source connection for each die;
a ground connection for each die;
at least one aperture for each die, extending through the probe card; and,
a light source supplying a beam of light to each probe card aperture.

19. A method for testing an integrated circuit die using a light source, the method comprising:
forming an integrated circuit die including a component and an optical region with an electrostatic discharge (ESD) protection circuit including a pair of diodes connected between power and ground;
physically connecting a power and ground connection to each die;
selectively activating the optical region;
introducing an optical test signal to the optical region;
converting the optical test signal to an electrical test current as follows;
introducing the optical signal to the ESD circuit diodes; and
generating a current through the diodes in response to the optical signal stimulus;
introducing the electrical test current to the component; and, electrically testing the component in response to the electrical test signal.

20. The method of claim 19, wherein introducing an optical test signal to the optical region includes introducing the optical test signal to a first optical region;
wherein electrically testing the component in response to the electrical test signal includes:
the component generating an electrical command signal;
introducing the electrical command signal to a second optical region; and,
converting the electrical command signal to light, whereby the component is identified as having been tested.

21. An integrated circuit die, the die comprising:
a component having an input to accept an electrical test signal and an output to supply an electrical command signal;
a selectively activated first optically sensitive device having an interface to accept an optical test signal the first optically sensitive device converting the optical test signal to an electrical test supplied at an output connected to the component input
a physical power connector;
a physical ground connector;
a first witch to selectively enable the power connector; and,
a second switch to selectively enable the ground connector.

22. The die of claim 21 further comprising:
a second optically sensitive device having an input connected to the component output to accept the electrical command signal, the second optically sensitive device converting the electrical command signal to a light signal emitted at an output.

23. The die of claim 21 wherein the optically sensitive device includes:
a first diode with a cathode connected to power and an anode connected to the component input; and,
a second diode with a cathode connected to the component input and an anode connected to ground.

24. A method of exercising components on integrated circuits; comprising the steps of:
providing a plurality of integrated circuits each having an optically sensitive device and a component wherein said optically sensitive device is electrically connected to said component;
simultaneously connecting each of the plurality of integrated circuits to an electrical source; and
optically stimulating as follows:
providing a fiber optic bundle having individual strands therein:
aligning selected ones of said individual strands with ones of said optically sensitive devices;
providing a light beam through said selected ones of said individual strands to optically stimulate ones of said optically sensitive devices; and,
simultaneously optically stimulating said optically sensitive devices so as to allow current to flow through said optically sensitive devices from said electrical source to said components so as to exercise said components.

25. A method of exercising components on integrated circuits; comprising the steps of:
providing a plurality of integrated circuits each having an optically sensitive device and a component wherein said optically sensitive device is electrically connected to said component;
simultaneously connecting each of the plurality of integrated circuits to an electrical source; and
optically stimulating as follows:
providing a probe card having an electrical lead connected at a first end to id electrical source and connected at a second end to a plurality of electrically conductive bumps;
connecting said electrically conductive bumps to ones of said integrated circuits; and,
simultaneously optically stimulating said optically sensitive devices so as to allow current to flow through said optically sensitive devices from said electrical source to said components so as to exercise said components.

26. A method for testing an integrated circuit die using a light source, the method comprising:
forming an integrated circuit die including a component and a first optical region;
selectively activating the first optical region;
introducing an optical test signal to the first optical region;
converting the optical test signal to an electrical test current;
introducing the electrical test current to the component: and
electrically testing the component in response to the electrical test signal as follows:
the component generating an electrical command signal;
introducing the electrical command signal to a second optical region; and,
converting the electrical command signal to light, whereby the component is identified as having been tested.

27. An integrated circuit die, the die comprising:
a component having an input to accept an electrical test signal and an output to supply an electrical command signal;
a selectively activated first optically sensitive device having an interface to accept an optical test signal, the first optically sensitive device converting the optical test signal to an electrical test supplied at an output connected to the component input; and,
a second optically sensitive device having an input connected to the component output to accept the electrical command signal, the second optically sensitive device converting the electrical command signal to a light signal emitted at an output.

28. An integrated circuit die, the die comprising;
a component having an input to accept an electrical test signal and an output to supply an electrical command signal;
a selectively activated first optically sensitive device having an interface to accept an optical test signal, the first optically sensitive device converting the optical test signal to an electrical test supplied at an output connected to the component input;
a physical power connector;
a physical ground connector;
wherein the optically sensitive device includes:
a first diode with a cathode connected to power and an anode connected to the component input; and,
a second diode with a cathode connected to the component input and an anode connected to ground.

* * * * *